United States Patent
Kato

(10) Patent No.: US 10,477,749 B2
(45) Date of Patent: Nov. 12, 2019

(54) ELECTRONIC COMPONENT MOUNTING MACHINE

(71) Applicant: FUJI CORPORATION, Chiryu (JP)

(72) Inventor: Daisuke Kato, Kuwana (JP)

(73) Assignee: FUJI CORPORATION, Chiryu (JP)

( * ) Notice: Subject to any disclaimer, the term of this patent is extended or adjusted under 35 U.S.C. 154(b) by 195 days.

(21) Appl. No.: 15/322,313

(22) PCT Filed: Jul. 2, 2014

(86) PCT No.: PCT/JP2014/067686
§ 371 (c)(1),
(2) Date: Dec. 27, 2016

(87) PCT Pub. No.: WO2016/002029
PCT Pub. Date: Jan. 7, 2016

(65) Prior Publication Data
US 2017/0142876 A1    May 18, 2017

(51) Int. Cl.
*B23P 19/00* (2006.01)
*H05K 13/04* (2006.01)
(Continued)

(52) U.S. Cl.
CPC ..... *H05K 13/0417* (2013.01); *H05K 13/0215* (2018.08); *H05K 13/0404* (2013.01);
(Continued)

(58) Field of Classification Search
CPC ............. H05K 13/0417; H05K 13/021; H05K 13/0404; H05K 13/08; H05K 13/0419;
(Continued)

(56) References Cited

U.S. PATENT DOCUMENTS 9,084,384 B2 * 7/2015 Sumi .................... H05K 13/021

FOREIGN PATENT DOCUMENTS

| CN | 101998819 A | * | 3/2011 |
| JP | 2005-116599 A |  | 4/2005 |
| JP | 2006216703 A | * | 8/2006 |

OTHER PUBLICATIONS

CN101998819A_TRANSLATED.pdf.*
(Continued)

*Primary Examiner* — Thiem D Phan
(74) *Attorney, Agent, or Firm* — Oblon, McClelland, Maier & Neustadt, L.L.P.

(57) ABSTRACT

An electronic component mounting machine includes: a mounting head that mounts electronic components onto a circuit board; a tape feeder which feeds a first tape material that accommodates a plurality of electronic components to the mounting head; a counting device which counts the number of electronic components remaining in the first tape material by subtracting the number of consumed electronic components which corresponds to an operating amount of the electronic component mounting machine from an initial value of the number of the electronic components accommodated in the first tape material; a detection device which detects a splice portion that joins a starting end of a second tape material to a tail end of the first tape material; and a determining device which determines whether or not a count value obtained by the counting device is within a predetermined normal range when the detection device detects the splice portion.

10 Claims, 2 Drawing Sheets

(51) Int. Cl.
  *H05K 13/08* (2006.01)
  *H05K 13/02* (2006.01)
(52) U.S. Cl.
  CPC ........... *H05K 13/08* (2013.01); *H05K 13/086* (2018.08); *Y10T 29/53174* (2015.01)
(58) Field of Classification Search
  CPC ................ H05K 13/02; H05K 13/0408; Y10T 29/53178; Y10T 29/49133; Y10T 29/53091; Y10T 29/4913; Y10T 29/53174; B65H 21/00
  USPC ......... 29/832, 833, 428, 739, 740, 714, 743, 29/757, 759, 809; 269/152; 414/278, 414/737; 700/222; 714/39
  See application file for complete search history.

(56) References Cited

OTHER PUBLICATIONS

JP2006216703A_TRANSLATED.pdf.*
International Search Report dated Sep. 9, 2014, in PCT/JP2014/067686 filed Jul. 2, 2014.

* cited by examiner

ELECTRONIC COMPONENT MOUNTING MACHINE

TECHNICAL FIELD

A technology disclosed here relates to an electronic component mounting machine which mounts electronic components on a circuit board.

BACKGROUND ART

In JP-A-2005-116599, an electronic component mounting machine (hereinafter, also referred to as a mounting machine) is disclosed. The mounting machine includes a tape feeder which feeds a tape material to a mounting head, a counting device which counts the number of electronic components remaining in the tape material, and a detection device which detects a splice portion which joins a starting end of a new tape material to a tail end of the tape material. The counting device is configured to reset a count value when the detection device detects the splice portion.

SUMMARY

According to the above-described mounting machine, when the detection device detects the splice portion, by resetting the count value, it is possible to eliminate an error of the count value which has been generated. However, reliability of the detection device is limited, and a case where the detection device detects a part which is not the splice portion as a splice portion can occur. In this case, when the counting device resets the count value, an error which is not allowable in the count value obtained by the counting device after this occurs.

The present description provides a technology which can solve or at least reduce the above-described problems.

When the detection device detects the splice portion, if the count value obtained by the counting device becomes a sufficiently small value, it is possible to determine that an actual splice portion is correctly detected. Meanwhile, when the count value is still a large value, it is possible to assume that the detection device causes malfunction, for example, a part which is not a splice portion is detected as a splice portion. In this manner, when the detection device detects the splice portion, it is possible to determine whether or not the detection device correctly determines an actual splicing portion with reference to the count value obtained by the counting device.

Based on the above-described knowledge, an electronic component mounting machine is disclosed. The electronic component mounting machine includes: a mounting head that mounts electronic components onto a circuit board; a tape feeder which feeds a first tape material that accommodates a plurality of electronic components to the mounting head; a counting device which counts the number of electronic components remaining in the first tape material by subtracting the number of consumed electronic components which corresponds to an operating amount of the electronic component mounting machine from an initial value of the number of the electronic components accommodated in the first tape material; a detection device which detects a splice portion that joins a starting end of a second tape material to a tail end of the first tape material; and a determining device which determines whether or not a count value obtained by the counting device is within a predetermined normal range when the detection device detects the splice portion.

According to the above-described configuration, when the detection device detects the splice portion, it is possible to determine appropriateness of detection performed by the detection device with reference to the count value obtained by the counting device. Accordingly, for example, it is possible to avoid inappropriate resetting or correcting of the count value obtained by the counting device, due to malfunction of the detection device.

DESCRIPTION OF EMBODIMENTS

Figure 1:
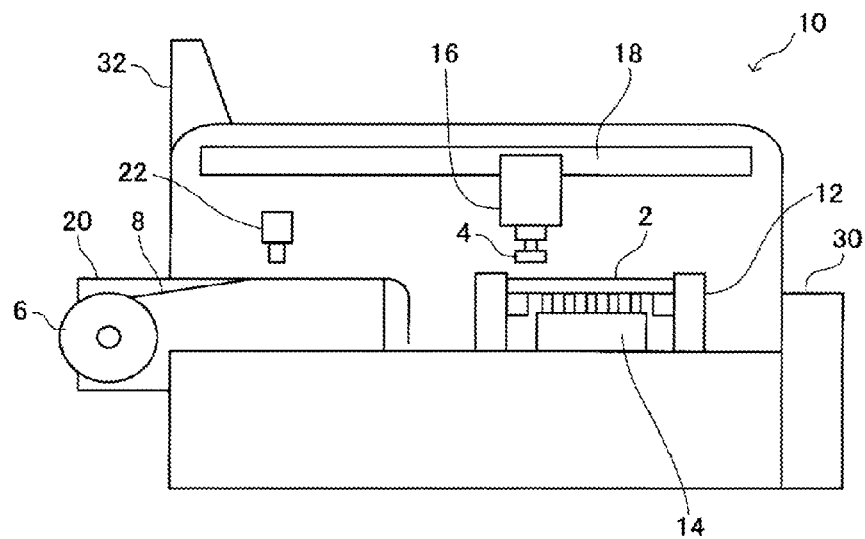
FIG. 1 is a view schematically illustrating a configuration of an electronic component mounting machine of an embodiment.

In an embodiment of the present technology, it is preferable that a determining device changes the above-described normal range in accordance with an initial value of the number of electronic components accommodated in a first tape material. According to the configuration, it is possible to correctly determine appropriateness of detection by the detection device in accordance with the various first tape materials in which the initial value of the number of electronic components varies.

In the above-described embodiment, the determining device may determine at least one of an upper limit or a lower limit that defines the above-described normal range by multiplying a predetermined coefficient by the initial value of the number of electronic components accommodated in the first tape material. Otherwise, the determining device may determine at least one of an upper limit or a lower limit that defines the normal range by subtracting a predetermined number from the initial value. By any of these methods, the determining device can change the normal range which is used in determining the count value obtained by the counting device in accordance with the initial value of the number of electronic components accommodated in the first tape material.

In the embodiment of the present technology, it is preferable that the electronic component mounting machine further includes a notifying device which performs a predetermined notification operation when the count value obtained by the counting device is out of the normal range. According to the configuration, when the detection device causes malfunction, the electronic component mounting machine can notify this, for example, to a worker or other devices.

In the above-described embodiment, it is preferable that the notifying device generates at least one of a sound, light, vibration, an electric signal, and an electric wave, to the outside as the notification operation. As a specific example, the notifying device may be a device which generates a predetermined warning sound, turns on predetermined warning lamp, performs a predetermined display on an optical display, such as a liquid crystal panel, and sends a predetermined warning signal to an external device in a wired or wireless manner.

In the embodiment of the present technology, it is preferable that the electronic component mounting machine further includes a correction device which corrects the count value obtained by the counting device to a predetermined normal value when the count value obtained by the counting device is within the normal range. According to the configuration, when the detection device correctly detects the splice portion, it is possible to correct the count value (which can include the errors) obtained by the counting device to a correct value.

In the above-described embodiment, the normal value may be the number of electronic components which is expected to remain in the first tape material when the detection device detects the splice portion. In addition, the expected number of electronic components can be determined in advance based on a distance between a detection position at which the detection device detects the splice portion and a pickup position at which the mounting head picks up the electronic components from the first tape material.

In the above-described embodiment, it is preferable that the normal value changes in accordance with the number of electronic components accommodated in the first tape material per unit length. According to the configuration, the correction device can correctly perform the correction of the count value in accordance with various types of first tapes.

EXAMPLE

An electronic component mounting machine 10 (hereinafter, also referred to as a mounting machine 10) of an example will be described with reference to the drawings. As illustrated in FIG. 1, the mounting machine 10 is a device which mounts a plurality of electronic components 4 on a circuit board 2. The mounting machine 10 includes a conveyor 12, a supporting device 14, a mounting head 16, a moving device 18, a plurality of tape feeders 20, a detection device 22, a control device 30, and a touch panel 32.

The conveyor 12 is a device which conveys in the circuit board 2 to the mounting machine 10, and conveys out the circuit board 2 on which the plurality of electronic components 4 are mounted from the mounting machine 10. The supporting device 14 is a device which supports the circuit board 2 conveyed in by the conveyor 12 at a position having a predetermined height. The mounting head 16 is a device which picks up the electronic component 4 from the tape feeder 20, and mounts the electronic component 4 onto the circuit board 2. The moving device 18 is a device which moves the mounting head 16 with respect to the tape feeder 20 and the supporting device 14.

Figure 2:
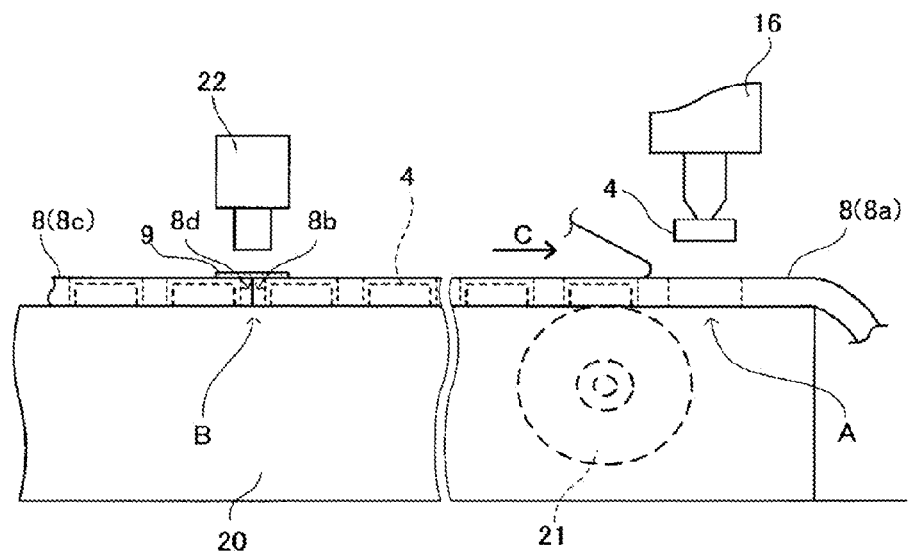
FIG. 2 is a view illustrating a tape material and a splice portion on a tape feeder.

The tape feeder 20 is a device which supplies the electronic component 4 to the mounting head 16. The tape feeder 20 is configured to be attachable to and detachable from the mounting machine 10. The tape feeder 20 feeds out a tape material 8 wound around a reel 6 to the mounting head 16. As illustrated in FIG. 2, the tape material 8 accommodates the plurality of electronic components 4 at an equal interval along the longitudinal direction. The tape feeder 20 intermittently feeds out the tape material 8 by a feeding mechanism 21. Accordingly, each of the electronic components 4 is disposed in order to a pickup position A. The electronic components 4 disposed at the pickup position A are picked up by the mounting head 16, and are mounted to the circuit board 2.

As the mounting machine 10 continues an operation, when a remaining part of the tape material 8 wound around the reel 6 decreases, splicing work is performed by the worker. As illustrated in FIG. 2, the splicing work is work of connecting a starting end 8d of a new tape material 8c (hereinafter, referred to as a second tape material), to a tail end 8b of a tape material 8a (hereinafter, referred to as a first tape material 8a) which is in use. As an example, two tape materials 8a and 8c are connected to each other, for example, by an adhesive tape 9. Hereinafter, a part at which the two tape materials 8a and 8c are connected to each other, is referred to as a splice portion.

The detection device 22 is a sensor which detects the above-described splice portion. A specific configuration of the detection device 22 is not particularly limited. As an example, the detection device 22 can be an optical sensor which detects the adhesive tape 9 of the splice portion. As illustrated in FIG. 2, a detection position B at which the detection device 22 detects the splice portion, is positioned further toward an upstream side than the pickup position A of the electronic component 4 regarding a feeding direction C of the tape material 8. Therefore, at the time when the splice portion reaches a detection position B by the detection device 22, it is expected that the electronic component 4 having the number obtained by multiplying the number of electronic components accommodated in the first tape material 8a per unit length by a distance from the pickup position A to the detection position B remains in the first tape material 8a. Hereinafter, the number is referred to as an expected remaining number.

Figure 3:
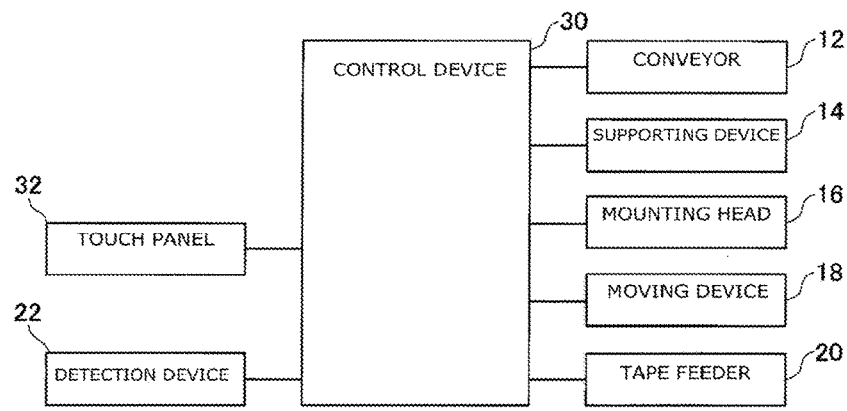
FIG. 3 is a view illustrating an electric configuration of the electronic component mounting machine.

The control device 30 is a device which controls operations of each portion of the mounting machine 10. The control device 30 can be configured of one or a plurality of computers. As illustrated in FIG. 3, the control device 30 is connected to the conveyor 12, the supporting device 14, the mounting head 16, the moving device 18, the tape feeder 20, and the touch panel 32 to be capable of being communicated, and can output various control signals to the members. In addition, the control device 30 is electrically connected to the detection device 22, and can receive the detection result (output signal) of the detection device 22.

The touch panel 32 is one of a user interface, receives various instructions from the worker, and can display various pieces of information to the worker. For example, when various errors occur in the mounting machine 10, the touch panel 32 can display the errors to the worker.

Figure 4:
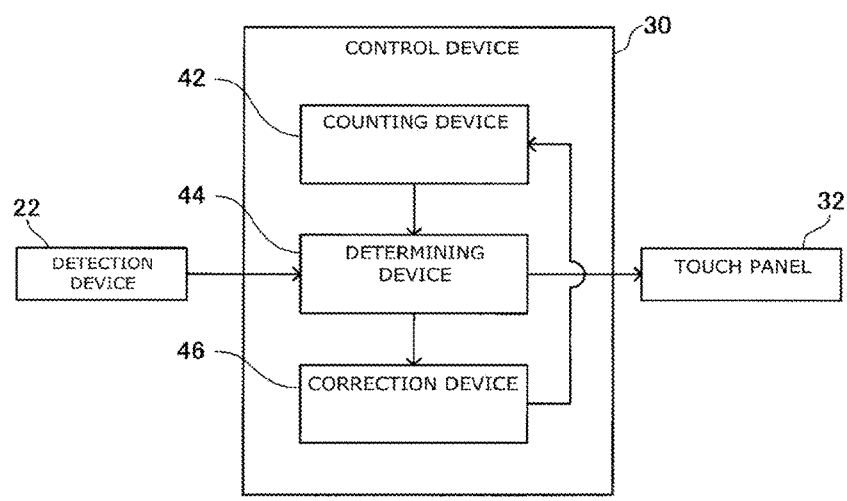
FIG. 4 is a view illustrating a functional configuration of a control device.

FIG. 4 is a block diagram illustrating a part of a functional configuration of the control device 30. As illustrated in FIG. 4, the control device 30 functionally includes a counting device 42, a determining device 44, and a correction device 46. The devices 42, 44, and 46 can be configured of hardware and software which configure the control device 30, and are not necessarily limited to devices which are independent from each other. In other words, two or more of the devices 42, 44, and 46 may be configured of common hardware.

The counting device 42 counts the number of electronic components which remain in the first tape material 8a. The counting device 42 counts the number of electronic components which remain in the first tape material 8a by subtracting the number of consumed electronic components 4 which corresponds to an operating amount of the mounting machine 10 from an initial value of the number of electronic components accommodated in the first tape material 8a. In addition, the initial value of the number of electronic components accommodated in the first tape material 8a may be instructed by the worker via the touch panel 32, or may be obtained from an external device which is called a data server. The counting device 42 can store the instructed or obtained initial value. In addition, the operating amount of the above-described mounting machine 10, for example, may be the operation number of the mounting machine 10, or may be operation time of the mounting machine 10.

The determining device 44 determines whether or not the count value obtained by the counting device 42 is within a predetermined normal range when the detection device 22 detects the splice portion. At the time when the splice portion reaches the detection position B by the detection device 22, in the first tape material 8a, the above-described expected remaining number of electronic components 4 is supposed to remain. Therefore, when the detection device 22 correctly detects the splice portion, the count value obtained by the counting device 42 becomes equivalent to the expected remaining number, or becomes a value which is close thereto. In addition, the count value does not necessarily match the expected remaining number, because the error which also cannot be avoided in the count value obtained by the counting device 42 can occur. Meanwhile, when the detection device 22 detects the splice portion, if the count value obtained by the counting device 42 is largely different from the expected remaining number, it is possible to assume that the detection device 22 causes malfunction, for example, the detection device 22 detects a part which is not the splice portion as the splice portion. Therefore, by determining whether or not the count value obtained by the counting device 42 is within a predetermined normal range, it is possible to determine whether the detection performed by the detection device 22 correctly detects the splice portion, or the malfunction is caused.

The above-described normal range can be appropriately set. The normal range may be a fixed range, or may change in accordance with various first tape materials 8a. As an example, the determining device 44 may determine at least one of an upper limit or a lower limit which defines the normal range by multiplying a predetermined coefficient by the initial value of the number of the electronic components accommodated in the first tape material 8a. For example, the determining device 44 may set the coefficient related to the upper limit value to be 0.1 after fixing the lower limit value to be 0. In this case, when the initial value is 10000, the upper limit value of the normal range becomes 10000× 0.1=1000, and a range of 0 to 1000 becomes a normal range.

Otherwise, the determining device 44 may determine at least one of the upper limit or the lower limit that defines the normal range by subtracting the predetermined number from the initial value of the number of electronic components accommodated in the first tape material 8a. For example, a subtracted value related to the upper limit value may be set to be 9000 after fixing the lower limit value to be 0. In this case, when the initial value is 10000, the upper limit value of the normal range becomes 10000−9000=1000, and a range of 0 to 1000 becomes a normal range.

Otherwise, the determining device 44 also has an effect of changing the normal range in accordance with the above-described expected remaining number. For example, the determining device 44 can determine at least one of the upper limit or the lower limit that defines the normal range by multiplying the predetermined coefficient by the expected remaining number of the first tape materials 8a. In addition, the determining device 44 can also determine at least one of the upper limit or the lower limit that defines the normal range by adding or subtracting the predetermined number to or from the expected remaining number of the first tape materials 8a. Furthermore, the above-described predetermined coefficient and/or the predetermined number is also effective in appropriately changing in accordance with an aspect of the first tape material 8a, or the type of the electronic component accommodated in the first tape material 8a.

When the count value obtained by the counting device 42 is out of the above-described normal range, the determining device 44 performs a notification operation by using the touch panel 32. Specifically, the determining device 44 outputs a predetermined error signal to the touch panel 32, and the touch panel 32 which has received the error signal displays the predetermined error signal on a predetermined error screen. Accordingly, the malfunction caused by the detection device is notified to the worker. In addition, instead of displaying the error signal by the touch panel 32, the mounting machine 10 may generate a sound, light, vibration, an electric signal, or an electric wave which indicates that the detection device 22 causes the malfunction to the outside as the notification operation. Here, for example, in a case where the malfunction of the detection device 22 occurs exceeding a predetermined frequency, the determining device 44 may perform processing of stopping a production operation of the mounting machine.

Meanwhile, if the count value obtained by the counting device 42 is within the above-described normal range, the correction device 46 performs processing of correcting the count value obtained by the counting device 42. The correction device 46 stores the above-described expected remaining number as a normal value used in correction, and rewrites the count value obtained by the counting device 42 to the normal value. Accordingly, the error in the count value obtained by the counting device 42 is removed. As described above, the expected remaining number, is the number of electronic components which is expected to remain in the first tape material 8a when the detection device 22 detects the splice portion, and changes in accordance with the number of electronic components accommodated in the first tape material 8a per unit length. Therefore, the correction device 46 may change the normal value in accordance with the number of electronic components accommodated in the first tape material 8a per unit length. In this case, the number of electronic components accommodated in the first tape material 8a per unit length may be instructed by the worker, or may be instructed from an external device which is called a data server. In addition, not being limited to the description above, the normal value used by the correction device 46 may be appropriately determined.

As described above, according to the mounting machine 10 of the example, when the detection device 22 detects the splice portion, it is possible to determine appropriateness of detection performed by the detection device 22 with reference to the count value obtained by the counting device 42. Accordingly, for example, when the detection device 22 causes the malfunction, it is possible to avoid inappropriate correction of the count value obtained by the counting device 42.

Above, specific examples of the present disclosure are described in detail, but the description above is merely an example, and does not limit the range of the claims. In the technology in the claims, various modifications and changes of the specific examples illustrated above are included.

For example, the position of the detection device 22 can appropriately change, and for example, the detection device 22 may be disposed in the mounting head 16. According to the configuration, it is possible to substantially match the pickup position A and the detection position B which are illustrated in FIG. 2. In this case, at the time when the detection device 22 detects the splice portion, since the number of electronic components remaining in the first tape material 8a becomes 0, regardless of the aspect of the first tape material 8a, the normal value of the above-described correction device 46 can be set to be 0.

The technical elements described in the present description or the drawings achieve technical usefulness by being independently used or being combined in a various manner, and are not limited to the combinations described in the claims when applying the patent. In addition, the technology illustrated in the present description or the drawings achieves a plurality of objects at the same time, and has technical usefulness only by achieving one of the plural objects.

REFERENCE SIGNS LIST

2: circuit board
4: electronic component
6: reel
8: tape material
8a: first tape material (tape material which is in use)
8b: tail end of first tape material
8c: second tape material (next tape material)
8d: starting end of second tape material
10: electronic component mounting machine
16: mounting head
20: tape feeder
22: detection device
30: control device
32: touch panel
42: counting device
44: determining device
46: correction device

The invention claimed is:

1. An electronic component mounting machine comprising:
   a mounting head that mounts electronic components onto a circuit board;
   a tape feeder which feeds a first tape material that accommodates a plurality of electronic components to the mounting head;
   a counting device which counts the number of electronic components remaining in the first tape material by subtracting the number of consumed electronic components which corresponds to an operating amount of the electronic component mounting machine from an initial value of the number of the electronic components accommodated in the first tape material;
   a detection device which detects a splice portion that joins a starting end of a second tape material to a tail end of the first tape material; and
   a determining device which determines whether or not a count value of the number of electronic components remaining in the first tape material obtained by the counting device when the detection device detects the splice portion is within a normal range, the normal range being predetermined,
   wherein the determining device determines that the detection device has malfunctioned when the count value obtained by the counting device when the detection device detects the splice portion is out of the normal range.

2. The electronic component mounting machine according to claim 1,
   wherein the determining device changes the normal range in accordance with the initial value of the number of the electronic components accommodated in the first tape material.

3. The electronic component mounting machine according to claim 2,
   wherein the determining device determines at least one of an upper limit of the normal range or a lower limit of the normal range by multiplying a coefficient by the initial value, the coefficient having a value between 0 and 1.

4. The electronic component mounting machine according to claim 2,
   wherein the determining device determines at least one of an upper limit of the normal range or a lower limit of the normal range by subtracting a number from the initial value, the number having a value between 0 and the initial value.

5. The electronic component mounting machine according to claim 1, further comprising:
   a notifying device which performs a notification operation when the count value obtained by the counting device when the detection device detects the splice portion is out of the normal range.

6. The electronic component mounting machine according to claim 5,
   wherein the notifying device generates at least one of a sound, light, vibration, an electric signal, or an electric wave as the notification operation.

7. The electronic component mounting machine according to claim 5,
   wherein the notification operation is a notification that the detection device has malfunctioned.

8. The electronic component mounting machine according to claim 1, further comprising:
   a correction device which corrects the count value obtained by the counting device to a normal value when the count value obtained by the counting device when the detection device detects the splice portion is within the normal range.

9. The electronic component mounting machine according to claim 8,
   wherein the normal value is the number of electronic components which is expected to remain in the first tape material when the detection device detects the splice portion.

10. The electronic component mounting machine according to claim 9,
    wherein the normal value changes in accordance with the number of electronic components accommodated in the first tape material per unit length.

* * * * *